US005397721A

United States Patent [19]

Hur

[11] Patent Number: 5,397,721

[45] Date of Patent: Mar. 14, 1995

[54] METHOD FOR FABRICATING VERTICAL THIN FILM TRANSISTOR

[75] Inventor: Chang W. Hur, Seoul, Rep. of Korea

[73] Assignee: Goldstar Electron Co., Ltd., Rep. of Korea

[21] Appl. No.: 186,795

[22] Filed: Jan. 25, 1994

[30] Foreign Application Priority Data

Jan. 29, 1993 [KR] Rep. of Korea ................. 1161/1993

[51] Int. Cl.[6] ........................................... H01L 21/265

[52] U.S. Cl. ........................................ 437/40; 437/62; 437/186; 437/197; 437/175; 257/57

[58] Field of Search ................. 437/186, 197, 41, 203, 437/62, 21, 175, 912, 40, 909, 917, 983, 62; 257/267, 242, 57; 148/DIG. 53, DIG. 117

[56] References Cited

U.S. PATENT DOCUMENTS

| | | | |
|---|---|---|---|
| 4,587,712 | 5/1986 | Baliga | 29/571 |
| 4,646,426 | 3/1987 | Sasaki | 29/571 |
| 4,654,959 | 4/1987 | Takafuji et al. | 29/571 |
| 4,980,308 | 12/1990 | Hayashi et al. | 437/41 |

*Primary Examiner*—George Fourson
*Assistant Examiner*—David M. Mason
*Attorney, Agent, or Firm*—Poms, Smith, Lande & Rose

[57] ABSTRACT

A method for fabricating a vertical thin film transistor capable of improving a current driving capability. The method includes the steps of sequentially forming a source electrode and a high concentration n type doped, first semiconductor layer over a substrate, selectively removing the source electrode and the first semiconductor layer at their portions at which a gate electrode is to be formed, sequentially depositing an insulating film and a metal layer for the gate electrode over the entire exposed surface of the resulting structure and then selectively removing the insulating film and the metal layer to form the gale electrode, anodizing an exposed surface of the gate electrode to form a gate insulating film, depositing an intrinsic, second semiconductor layer over the entire exposed surface of the resulting structure and depositing a high concentration n type doped, third semiconductor layer over the second semiconductor layer, and forming a drain electrode over the third semiconductor layer.

9 Claims, 5 Drawing Sheets

19
18
17

17
16
15
11
12
13
14

F I G. 4a
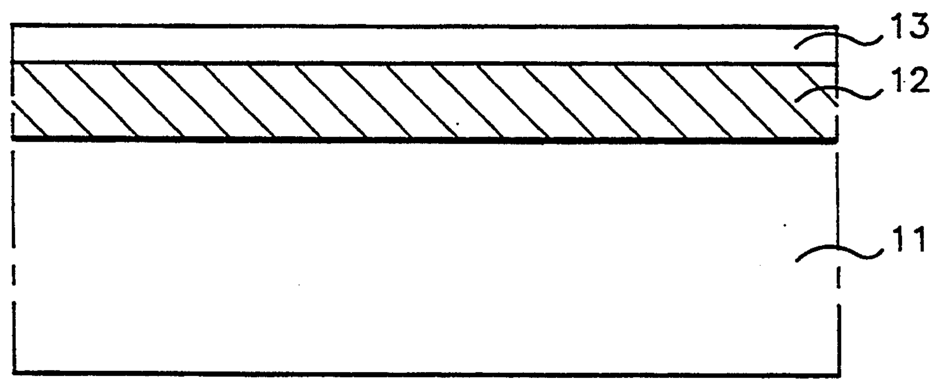
F I G. 4b
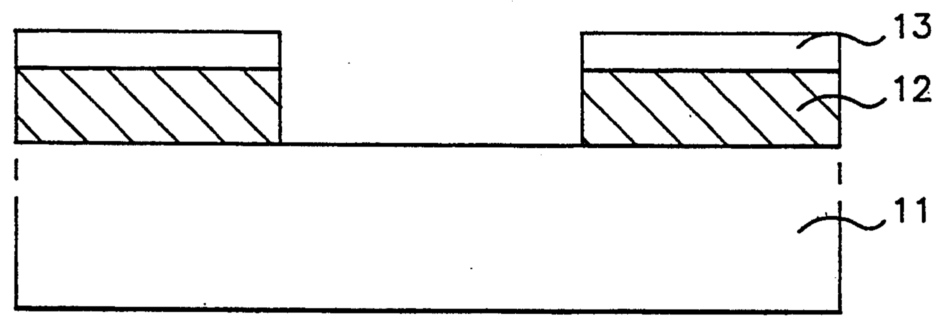
F I G. 4c
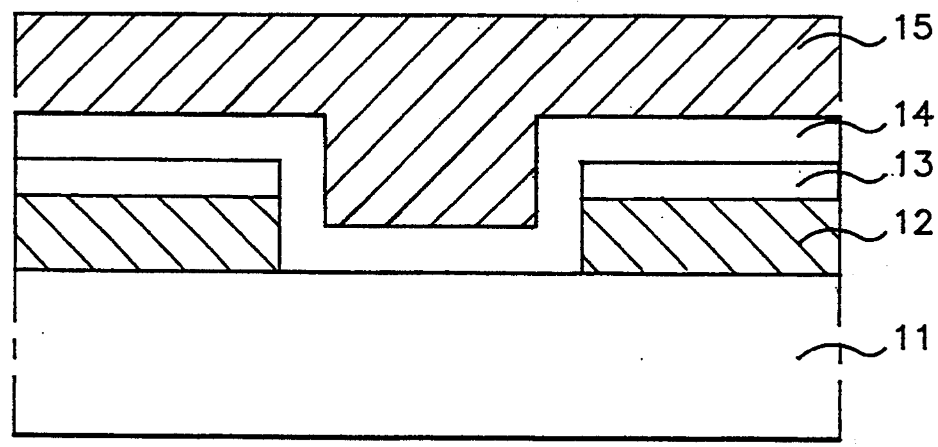

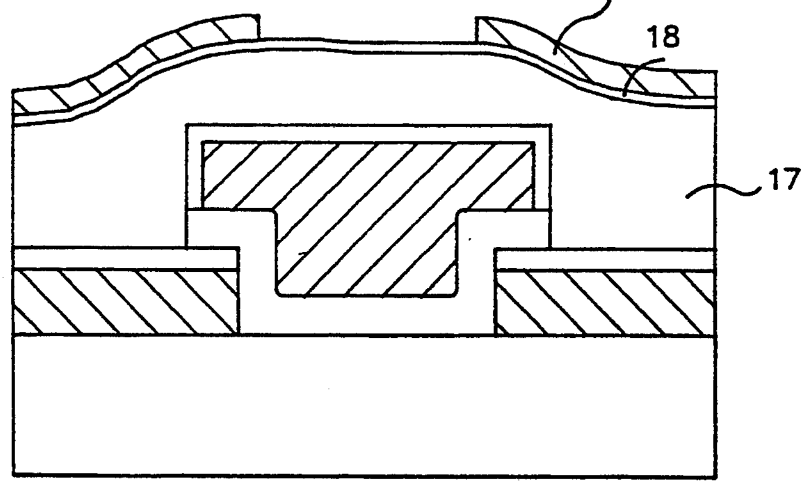
F I G .4g
19
18
17
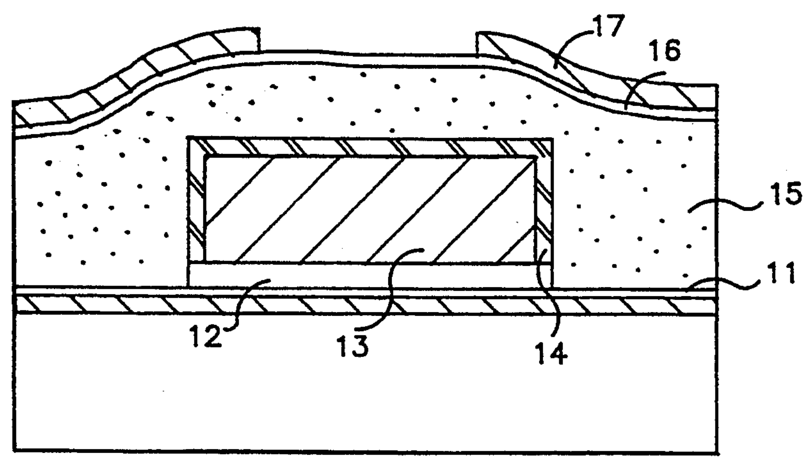
F I G . 5
17
16
15
11
12
13
14
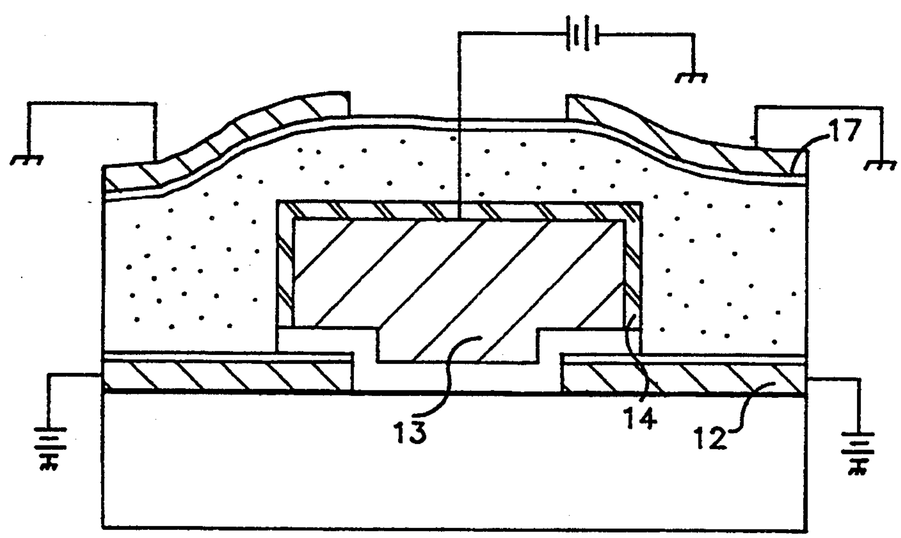
F I G . 6
17
13
14
12

METHOD FOR FABRICATING VERTICAL THIN FILM TRANSISTOR

BACKGROUND OF THE INVENTION

The present invention relates to thin film transistors, and more particularly to a method for fabricating a vertical thin film transistor capable of improving a current driving capability.

General, thin film transistors may be used in SRAM devices of 1M grade or above in place of load resistors. Also, such thin film transistors are widely used as switching devices for switching a picture data signal in each pixel region of liquid crystal displays (LCDs) and for sequentially switching photo charges generated in each photodiode of contact image sensors.

In such thin film transistors used as switching devices in integrated LCDs or contact image sensors, an accurate and rapid switching function can be achieved in so far as no leakage current is generated between a source and a drain and a parasitic capacitance present between a gate and the source/drain is maintained in a small level.

FIGS. 1*a* to 1*c* are sectional views respectively illustrating a method for fabricating a conventional vertical thin film transistor. FIG. 2 is a sectional view explaining an operation of the vertical thin film transistor fabricated in accordance with the method of FIGS. 1*a* to 1*c*. On the other hand. FIG. 3 is a graph illustrating a voltage-current variation between a source and a drain in the vertical thin film transistor of FIG. 2 depending on a gate voltage.

In accordance with the conventional method, a gate electrode 2 is formed over a glass substrate 1, as shown in FIG. 1*a*. Over the gate electrode 2, a gate insulating film 3, a first intrinsic amorphous silicon (i-a-Si:H) layer 4 and a high concert%ration n ($n^+$) type doped amorphous silicon ($n^+$a-Si:H) layer 5 and a metal electrode 6 for an ohmic contact are sequentially formed, in this order.

As shown in FIG. 1*b*, the metal electrode 6 and the high concentration n type doped amorphous silicon 5 is selectively removed to form source electrodes 6*a*.

Subsequently, a second intrinsic amorphous silicon (i-a-Si:H) layer 4*a* to be used as an active layer is deposited to a thickness of several ten hundreds angstroms over the entire exposed surface of the resulting structure, as shown in FIG. 1*c*. Over the second intrinsic amorphous silicon layer 4*a*, a high concentration n type doped amorphous silicon layer 7 for an ohmic contact and a metal electrode 8 to be used as a drain electrode are sequentially deposited. Thus a vertical thin film transistor is fabricated.

The conventional vertical thin film transistor has a structure in which the gate electrode 2 is disposed at the lower portion of the structure while the source electrode 6*a* and the drain electrode 8 are disposed above the gate electrode 2.

Operation of the conventional vertical thin film transistor having the abovementioned structure will now be described.

In FIG. 2, the upper surface of the source electrode 6*a* has a Schottky contact characteristic whereas the lower surface of the source electrode 6*a* is in contact with the high concentration n type doped amorphous silicon layer 5*a* and thus has an ohmic contact characteristic. Accordingly, when a voltage is applied to the gate electrode 2, a channel is formed in the first intrinsic amorphous silicon layer 4 disposed beneath the source electrode 6*a* by virtue of an electric field generated by the applied voltage. As a voltage is applied to the source electrode 6*a*, current flows from the lower surface of the source electrode to the drain electrode 8.

FIG. 3 is a graph illustrating a variation in current flowing through the source and drain depending on the voltage applied to the gate electrode 2. As shown in FIG. 3, when the voltage applied to the gate electrode 2 has a higher level, the amount of current flowing between the source and drain is increased. As the voltage between the source and drain becomes higher, the amount of current flowing between the source and drain is also increased.

However, the conventional vertical thin film transistor has the following problems.

First, the gate electrode 2 can not control the channel in one direction. Although a Schottky contact characteristic is provided between the source electrode 6*a* and the intrinsic amorphous silicon layer disposed over the source electrode 6*a*, it is weak. As a result, a leakage current may flow between the source and drain when the voltage difference between the source and drain is high. Due to such a leakage current, the thin film transistor has a degraded reliability.

Second, the fabrication is complex because two intrinsic amorphous silicon layers as active layer are formed. Such a complex fabrication results in a long fabrication time and thereby a reduced productivity.

Third, the characteristic of the thin film transistor is degraded because a parasitic capacitance is present between the source and drain.

SUMMARY OF THE INVENTION

Therefore, an object of the invention is to solve the above-mentioned problems encountered in the prior art and to provide a method for fabricating a vertical thin film transistor capable of exhibiting a reduced series resistance generated at a region above a source electrode to exhibit a good channel conductivity thereby obtaining a good current ON/OFF ratio.

In accordance with the present invention, this object can be accomplished by providing a method for fabricating a vertical thin film transistor, comprising the steps of: sequentially forming a source electrode and a high concentration n type doped, first semiconductor layer over a substrate; selectively removing said source electrode and said first semiconductor layer at their portions at which a gate electrode is to be formed; sequentially depositing an insulating film and a metal layer for said gate electrode over the entire exposed surface of the resulting structure and then selectively removing said insulating film and said metal layer to form the gate electrode; anodizing an exposed surface of the gate electrode to form a gate insulating film; depositing an intrinsic, second semiconductor layer over the entire exposed surface of the resulting structure and depositing a high concentration n type doped, third semiconductor layer over said second semiconductor layer; and forming a drain electrode over said third semiconductor layer.

BRIEF DESCRIPTION OF THE DRAWINGS

Other objects and aspects of the invention will become apparent from the following description of embodiments with reference to the accompanying drawings in which:

FIGS. 4*a* to 4*g* are sectional views respectively illustrating a method for fabricating a vertical thin film transistor in accordance with a first embodiment of the present invention; and FIG. 5 is a sectional view illustrating a vertical thin film transistor fabricated in accordance with a second embodiment of the present invention.

FIG. 6 is a sectional view illustrating a vertical thin film transistor of the above-mentioned embodiments showing operational characteristics.

DETAILED DESCRIPTION OF THE PREFERRED EMBODIMENTS

Figure 1A:
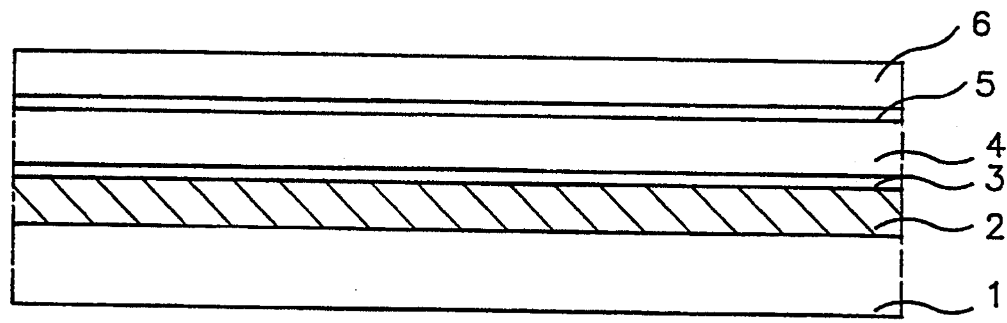
FIGS. 1*a* to 1*c* are sectional views respectively illustrating a method for fabricating a conventional vertical thin film transistor.
Figure 1B:
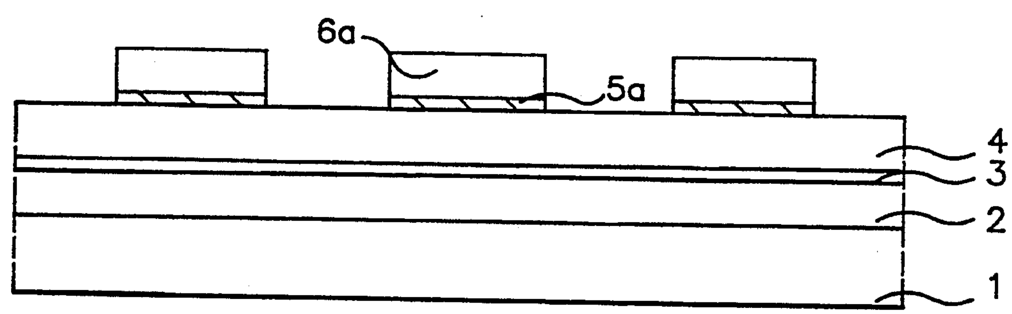
Figure 1C:
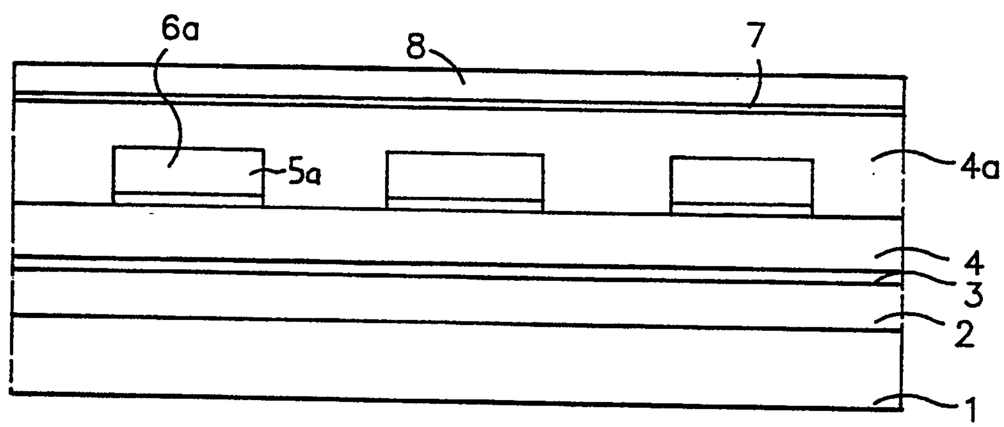
Figure 2A:
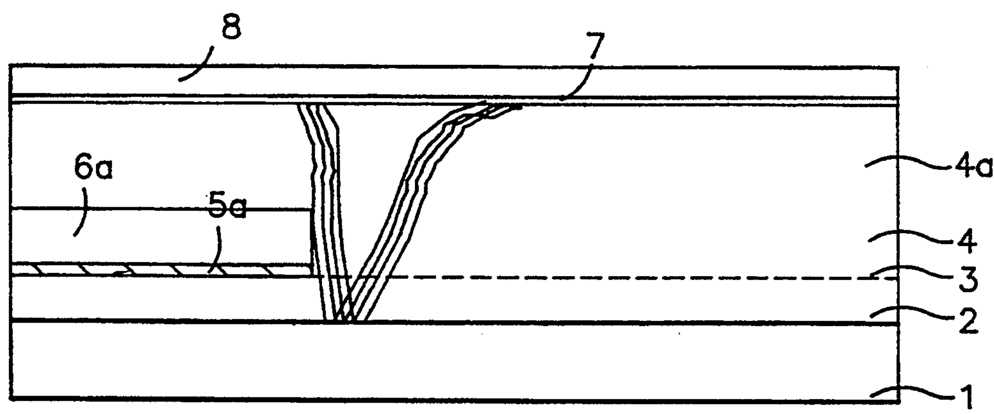
FIG. 2*a* is a sectional view explaining an operation of the vertical thin film transistor fabricated in accordance with the method of FIGS. 1*a* to 1*c*.
Figure 3:
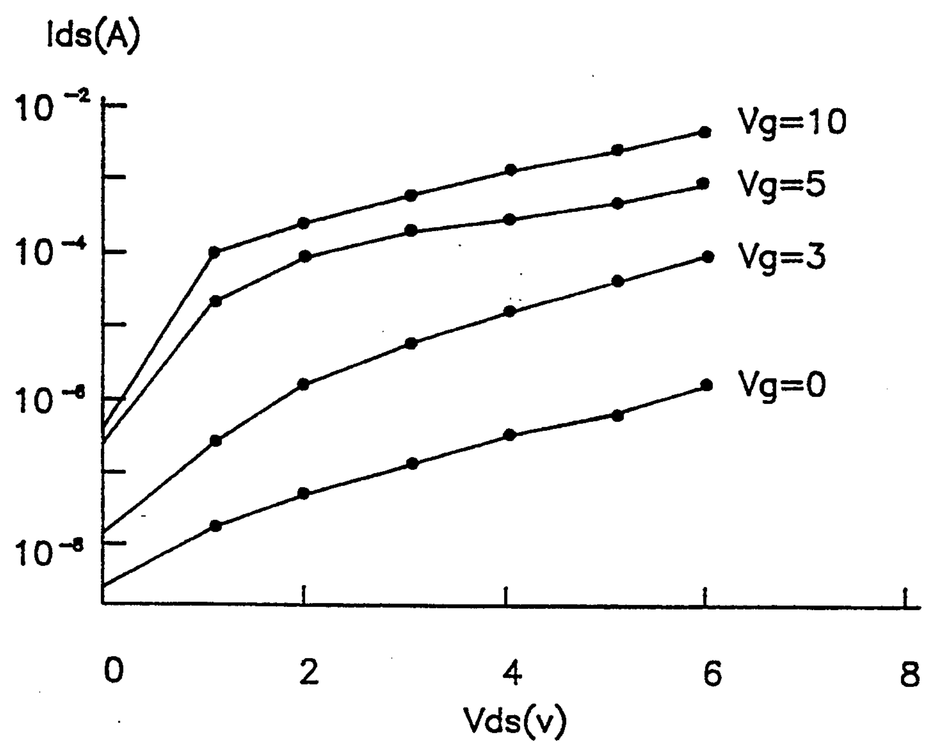
FIG. 3 is a graph illustrating a voltage-current variation between a source and a drain in the vertical thin film transistor of FIG. 2 depending on a gate voltage.

FIGS. 4*a* to 4*g* are sectional views respectively illustrating a method for fabricating a vertical thin film transistor in accordance with a first embodiment of the present invention.

In accordance with the first embodiment, a source electrode 12 is deposited to a thickness of several ten hundreds angstroms over a glass substrate 11 by use of a vacuum deposition equipment such as a sputter or an evaporator, as shown in FIG. 4*a*. Over the source electrode 12, a high concentration n type doped amorphous silicon (n+a-Si:H) layer 13 is then deposited to a thickness of several hundreds angstroms by use of the plasma enhanced chemical vapor deposition (PECVD) process.

As shown in FIG. 4*b*, the source electrode 12 and the high concentration n type doped amorphous silicon layer 13 are Then selectively removed at their central portions where a gate electrode is to be formed.

Over the entire exposed surface of the resulting structure, an insulating film 14 made of SiN or $SiO_2$ is deposited, as shown in FIG. 4*c*. An aluminum layer 15 for a gate electrode is deposited to a thickness of several ten hundreds angstroms over he insulating film 14 by use of a vacuum deposition equipment such as a sputter, an E-beam and an evaporator.

The aluminum layer 15 is then selectively removed by use of a photo etch process using a gate mask, thereby forming a gate electrode 15*a*. Thereafter, an alumina ($Al_2O_3$) layer 16 is formed over the exposed surface of the gate electrode.

The alumina layer 16 is formed to a thickness of about 2,000 Å by anodizing the exposed gate elect, rode 15*a* in an electrolytic solution containing sulfuric acid or boric acid in a concentration of 12 to 25 wt % at a temperature of 20° C. and at a current density of 130 to 250 $A/m^2$.

Figure 4D:
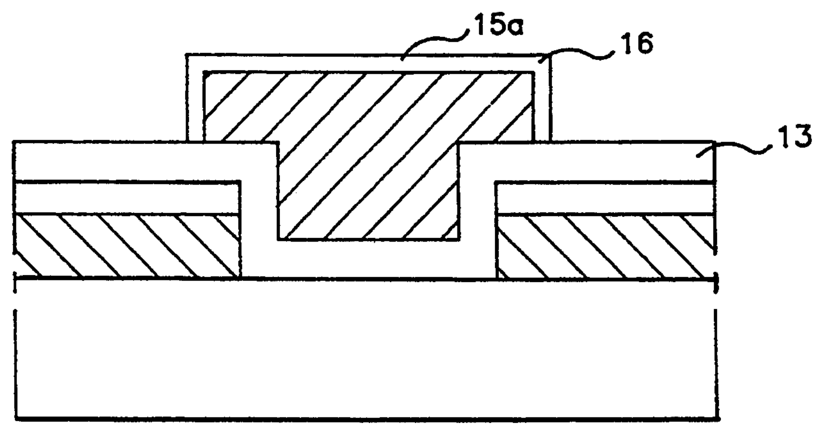
Figure 4E:
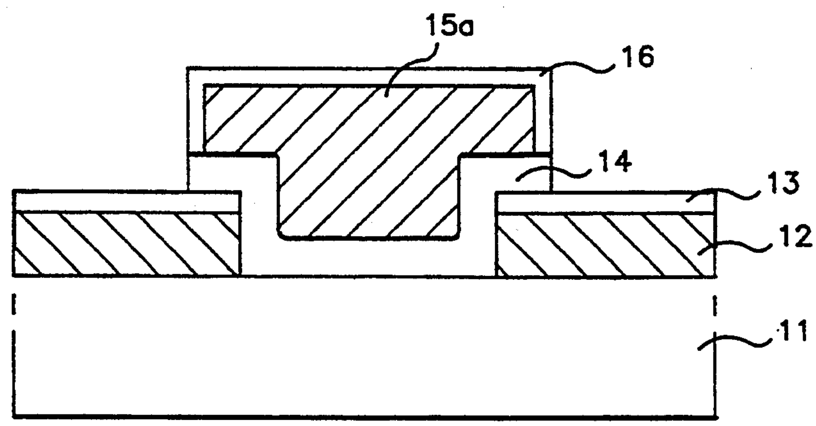

Using the gate electrode 15*a* and the alumina layer 16 as a mask, the exposed insulating film 14 is selectively removed, as shown in FIG. 4*e*.

Figure 4F:
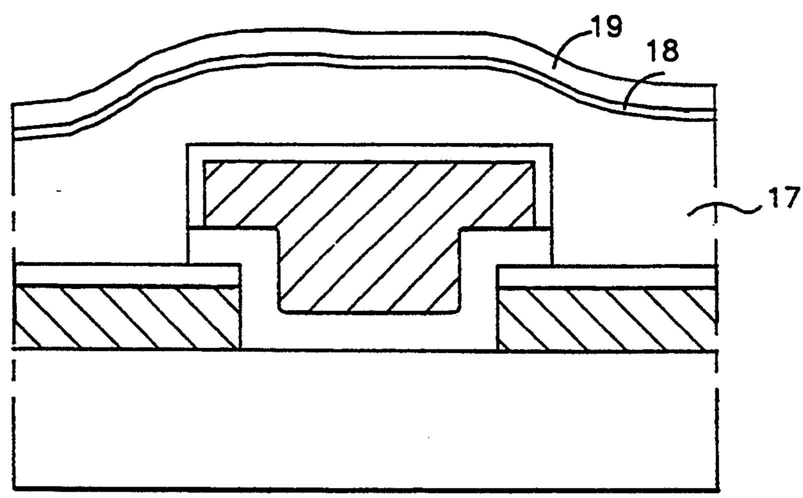

Over the entire exposed surface of the resulting structure, an intrinsic amorphous silicon layer 17 is then deposited to a thickness of several ten hundreds angstroms identical to that of the gate electrode 15*a* by use of the PECVD process, as shown in FIG. 4*f*. Thereafter, a high concentration n type doped amorphous silicon layer 18 for an ohmic contact is deposited over the intrinsic amorphous silicon layer 17. Subsequently, a metal electrode 19 for a drain is deposited over the high concentration n type doped amorphous silicon layer 18 by use of a vacuum deposition equipment. The intrinsic amorphous silicon layer 17 has the same thickness as that of the aluminum layer 15.

As shown in FIG. 4*g*, the metal electrode 19 is then selectively removed at its predetermined portion disposed above the gate electrode 15*a*. Thus a vertical thin film transistor is obtained.

FIG. 5 is a sectional view illustrating a vertical thin film transistor fabricated in accordance with a second embodiment of the present invention. In FIG. 5, elements corresponding to those in FIGS. 4*a* to 4*g* are denoted by the same reference numerals.

In accordance with the second embodiment, a source electrode 12 and a high concentration n type doped amorphous silicon layer 13 are sequentially deposited over a glass substrate 11, as shown in FIG. 4*a*.

Over the entire exposed surface of the resulting structure, an insulating film 14 and an aluminum layer 15 are sequentially deposited without any selective removal of the source electrode 12 and the high concentration n type doped amorphous silicon layer 13 as shown in FIG. 4*b*. Subsequent steps for fabricating the thin film transistor shown in FIG. 5 are the same as those shown in FIGS. 4*d* to 4*g*.

In accordance with the abovementioned embodiments, intrinsic polysilicon may be used in place of the intrinsic amorphous silicon. In place of the high concentration n type amorphous silicon, microcrystal silicon may be used.

Although tile first embodiment of the present invention uses complex steps over the second embodiment, it provides an advantage of a small parasitic capacitance present between the gate electrode 15*a* and the source electrode 12, resulting in no generation of noise.

On the other hand, the second embodiment uses simple steps over the first embodiment, even though a higher parasitic capacitance are generated between the gate electrode 15*a* and the source electrode 12.

Now, an operation of each vertical thin film transistor fabricated in accordance with the abovementioned embodiments of the present, invention will be described, in conjunction with FIG. 6.

As a positive voltage is applied to the gate electrode 15*a* while grounding the drain electrodes 19*a* and 19*b*, an electric field is generated in he alumina layer 16 on the gate electrode 15*a*. By the electric field, negative charges are concentrated at an interface between the alumina 16 and the intrinsic amorphous silicon layer 17 in contact with the alumina 16.

When the gate voltage applied to the gate electrode 15*a* is more than a predetermined level (threshold voltage), a channel is formed so that current can flow between the source and drain. Accordingly, a flow of current is made when a voltage is applied to the source electrode 12.

Since the source and drain electrodes are vertically spaced from each other, the current flows vertically between the source and drain.

In the vertical thin film transistor structure, the vertical thickness of the intrinsic amorphous silicon layer 17 corresponds to the length of the channel while the horizontal length of the source electrode 12 corresponds to the width of the channel, as compared to general planar thin film transistor structures.

The abovementioned vertical thin film transistors of the present invention have the following effects.

First, an easy adjustment of the channel by the gate voltage can be achieved, as compared to conventional vertical thin film transistors.

In accordance with the present invention, a superior channel conductivity can be obtained because the channel is formed throughout the entire interface between the gate electrode and the active layer. Accordingly, the channel adjustment can be easy. In the conventional thin film transistor structure in which the source electrode is disposed between the upper drain electrode and the lower gate electrode, however, no channel is formed above the source electrode when current flows, resulting in an increase in series resistance generated at a region above the source electrode and thereby a very reduced channel conductivity.

Second, a good current ON/OFF ratio depending on the applied gate voltage is obtained. Accordingly, an operation as a transistor for high current can be achieved. In other words, the ON/OFF current ratio depending on the applied gate voltage can be improved because channels are formed on both sides of the gate and a superior channel conductivity is obtained.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a vertical thin film transistor, comprising the steps of:

sequentially forming a source electrode and a n type doped first semiconductor layer over a substrate;

selectively removing said source electrode and said first semiconductor layer at portions at which a gate electrode is to be formed;

sequentially depositing an insulating film and a metal layer for said gate electrode over the entire exposed surface of the resulting structure and then selectively removing said insulating film and said metal layer to form the gate electrode;

anodizing the exposed surface of the gate electrode to form a gate insulating film;

depositing an intrinsic, second semiconductor layer over the entire exposed surface of the resulting structure and depositing a n type doped third semiconductor layer over said second semiconductor layer; and forming a drain electrode over said third semiconductor layer.

2. A method in accordance with claim 1, wherein said metal layer for said gate electrode is made of aluminum.

3. A method in accordance with claim 1, wherein said anodizing step is carried out under a condition of using a boric acid electrolyte solution or a sulfuric acid electrolyte solution, a temperature of 20° C., a current density of 130 to 260A/m$^2$ and while using aluminum as the material of said metal layer so as to form an alumina layer as said gate insulating film.

4. A method in accordance with claim 1, wherein said first and third semiconductor layers are made of one of an amorphous silicon and a microcrystal silicon.

5. A method in accordance with claim 1, wherein said second semi conductor layer is made of one of an amorphous silicon and a polysilicon.

6. A method in accordance with claim 1 or claim 3, wherein said gate insulating film has a thickness of about 2,000 Å.

7. A method in accordance with claim 1, wherein said metal layer and said second semiconductor layer have the same thickness.

8. A method for fabricating a vertical thin film transistor, comprising the steps of:

Sequentially forming a source electrode and an n type doped first semiconductor layer over a substrate;

sequentially depositing an insulating film and a metal layer for said gate electrode over said first semiconductor layer and then selectively removing said insulating film and said metal layer to form the gate electrode;

anodizing the exposed surface of the gate electrode to form a gate insulating film;

depositing an intrinsic, second semiconductor layer over the entire exposed surface of the resulting structure and depositing an n type doped third semiconductor layer over said second semiconductor layer; and forming a drain electrode over said third semiconductor layer.

9. A method in accordance with claim 8, wherein said metal layer for said gate electrode is made of aluminum.

* * * * *